United States Patent [19]

Hada

[11] Patent Number: 5,753,555
[45] Date of Patent: May 19, 1998

[54] METHOD FOR FORMING SEMICONDUCTOR DEVICE

[75] Inventor: Hiromitsu Hada, Tokyo, Japan

[73] Assignee: NEC Corporation, Japan

[21] Appl. No.: 736,193

[22] Filed: Oct. 24, 1996

[30] Foreign Application Priority Data

Nov. 22, 1995 [JP] Japan ................. 7-304793

[51] Int. Cl.⁶ ................................ H01L 21/336
[52] U.S. Cl. ................ 438/300; 117/9; 117/902; 117/935
[58] Field of Search ............ 437/89, 973; 117/902, 117/913, 935, 9; 438/300, 607, 482

[56] References Cited

U.S. PATENT DOCUMENTS

| | | | |
|---|---|---|---|
| 5,124,276 | 6/1992 | Samata et al. | 437/89 |
| 5,130,268 | 7/1992 | Liou et al. | 437/89 |
| 5,356,830 | 10/1994 | Yoshikawa et al. | 437/89 |
| 5,393,681 | 2/1995 | Witek et al. | 437/89 |

FOREIGN PATENT DOCUMENTS

| | | | |
|---|---|---|---|
| 63-44725 | 2/1988 | Japan | 437/89 |
| 3-49259 | 3/1991 | Japan . | |

*Primary Examiner*—John Niebling
*Assistant Examiner*—Michael S. Lebentritt
*Attorney, Agent, or Firm*—Hayes, Soloway, Hennessey, Grossman & Hage, P.C.

[57] ABSTRACT

A method is provided for forming an epitaxial silicon layer on a diffused region of a silicon substrate having an anisotropic ratio of more than 3:1 between the growth rate in the direction perpendicular to the substrate surface and the growth rate in the direction parallel to the substrate surface. The epitaxial silicon layer serves as a contact plug which does not contact an adjacent contact plug formed by the same process in order to obtain a reliable semiconductor memory device with a high throughput, which is free from short circuit failure.

22 Claims, 6 Drawing Sheets

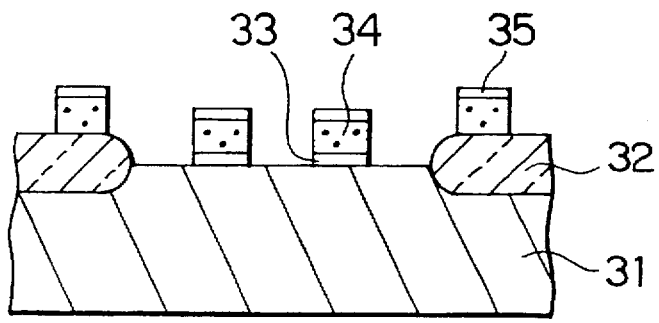
FIG. IA
PRIOR ART
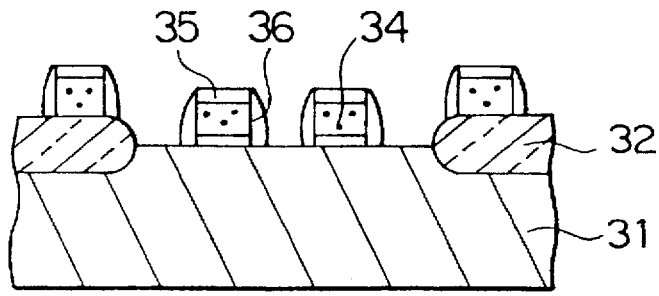
FIG. IB
PRIOR ART
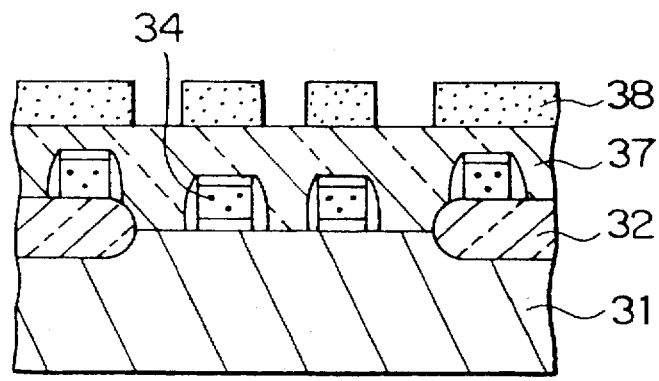
FIG. IC
PRIOR ART
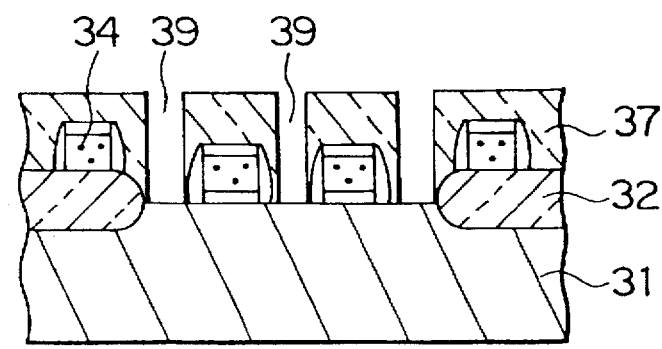
FIG. ID
PRIOR ART

METHOD FOR FORMING SEMICONDUCTOR DEVICE

BACKGROUND OF THE INVENTION (a) Field of the Invention

The present invention relates to a method for manufacturing a semiconductor device and, in particular, to a method of forming a contact plug by a selective epitaxial technique in a semiconductor device.

(b) Description of the Related Art

Recently, with the advance of semiconductor technology, a trend toward smaller design rules for semiconductor devices has proceeded to the extent that alignment margin can hardly be secured when aligning a contact plug with a semiconductor layer or interconnect layer underlying the contact plug. Accordingly, for sub-quarter-micron semiconductor devices, a manufacturing process is employed which permits the contact plug to be formed by self-alignment with a semiconductor layer or interconnect layer underlying the contact plug.

To provide such a self-aligned contact plug a conventional method as illustrated in FIGS. 1A to 1D is used. In FIG. 1A, a field oxide film 32 is provided on a silicon substrate 31 for separation, and a gate oxide film 33, a polycrystalline silicon film 34 and a silicon nitride film 35 are consecutively deposited thereon. Subsequently, a gate electrode 34 is formed by patterning, leaving the silicon nitride film 35 disposed on top of the gate electrode 34. Then, a silicon nitride film 36 is formed over the entire surface, followed by an etch-back process, thereby forming a sidewall of silicon nitride film 36 on the lateral sides of the gate electrode 34, as shown in FIG. 1B.

Thereafter, an interlayer insulating film 37 made of silicon oxide is formed and subjected to flattening, followed by forming a contact mask 38 made of a photoresist layer, as shown in FIG. 1C. By using the contact mask 38, a selective etching for forming contact holes 39 is conducted to the interlayer insulating film 37 under conditions which provide sufficient selectivity from the silicon nitride films 35 and 36. Since the silicon nitride films 35 and 36 are hardly etched, contact holes 39 are expected to be formed by self-alignment without exposure of the gate electrode 34 even in the event that slight misalignment occurs during formation of the contact mask 38, as illustrated in FIG. 1D.

However, even if the etching of the interlayer insulating film 37 takes place under condition which provide sufficient etching selectivity from the silicon nitride films 35 and 36, there is the possibility in fact in the conventional method that the gate electrode 34 is apt to be exposed, especially at a corner region of the silicon nitride film 35 deposited on the gate electrode 34, due to a higher etching rate on the corner of the silicon nitride film 35.

In order to prevent exposure of the gate electrode 34, the thickness of the silicon nitride film 35 formed on the gate electrode 34 should be increased. However, in this case, the interlayer insulating film 37 should be thicker, causing increased aspect ratio of the contact hole 39 to be formed. When misalignment of the contact hole 39 increases with respect to the gate structure, the effective area of the contact hole will be reduced, causing an increase in contact resistance thereof.

In view of the foregoing, there is proposed a technique which forms a contact plug by utilizing a selective epitaxial growth technique. For example, Patent Publication No. JP-A1991-49,259 proposes a technique in which a silicon layer is selectively grown on source/drain regions of a MOS transistor in order to form a silicon layer as a contact plug. If this technique is applied for forming the contact plugs in the semiconductor device shown in FIGS. 1A to 1D, the epitaxial silicon layer will be grown in the source/drain regions before the interlayer insulating film is formed. After the interlayer insulating film is grown subsequently, contact plugs penetrating the interlayer insulating film can be formed without etching of the interlayer insulating film to thereby save manufacturing steps.

However, it is known that in a usual selective growth technique for a silicon layer, the silicon layer will grow isotropically. If the silicon layer, which is to be provided as a contact plug, is grown in the vertical direction with respect to the substrate surface, it will also grow in the horizontal direction over the field oxide film, with the consequence that adjacent silicon layers or contact plugs contact each other as they grow, thereby causing electrical short-circuit failure. Accordingly, it is difficult in practice to form a silicon contact plug by the selective epitaxial growth technique in a sub-quarter-micron semiconductor device. For the sake of reference, when it is intended to form a silicon contact plug having a film thickness of 0.3 μm, the silicon layer also grows in the horizontal direction to a width of 0.3 μm. Accordingly, if separation between elements is equal to or less than 0.6 μm, adjacent silicon layers which are grown on the field oxide film will cause short-circuit failure.

SUMMARY OF THE INVENTION

It is an object of the invention to provide a method for forming a semiconductor device in which a contact plug is formed by a selective epitaxial growth technique.

In accordance with a first aspect of the present invention there is provided a method for forming a semiconductor device including the steps of forming a diffused region in a portion of a surface region of a semiconductor substrate of a first material, and selectively growing a semiconductor layer of the first material on the diffused layer under a condition that a ratio of a growth rate in a first direction perpendicular to the surface of the semiconductor substrate to a growth rate in a second direction parallel to the surface of the semiconductor substrate is not lower than about 3:1.

In accordance with second aspect of the present invention, there is provided a method for forming a semiconductor device including the steps of forming consecutively a gate oxide film and a gate electrode on a semiconductor substrate made of a first material, introducing impurity ions into a portion of a surface region of the semiconductor substrate by a self alignment with the gate electrode to form a diffused region, forming an insulating layer covering an entire surface other than at least a portion of the diffused region, selectively growing the first material on at least the portion of the diffused region to form a semiconductor layer under a condition that a growth rate in a first direction perpendicular to the surface of the semiconduct or substrate is larger than a growth rate in a second direction parallel to the surface of the semiconductor substrate, forming an insulating layer at least on the semiconductor layer, and forming a conductive layer on the insulating layer.

In accordance with a third aspect of the present invention, there is provided a method for forming a semiconductor device including the steps of forming consecutively a first insulating film and a gate electrode on a semiconductor substrate, forming a second insulating film having a first surface in contact with a side of the gate electrode, introducing impurity ions in a region of the semiconductor substrate adjacent to a second surface of the second insulating film to form a diffused region of a first conductivity type, forming a first selective epitaxial layer of a second conductivity type on the second side of the second insulating film and on the diffused region, and forming a second selective epitaxial layer on the first selective epitaxial layer.

With the method according to the present invention, since the anisotropy of the selective epitaxial growth is sufficient to grow contact plugs under the condition that adjacent two of contact plugs do not contact each other to cause short-circuit failure, a reliable semiconductor device can be obtained with a high throughput.

BRIEF DESCRIPTION OF THE DRAWINGS

FIGS. 1A to 1D are cross-sectional views of a semiconductor device for illustrating a conventional method for manufacturing the semiconductor device;

DESCRIPTION OF THE PREFERRED EMBODIMENTS

Several embodiments of the invention will now be described with reference to the drawings. FIGS. 2A to 2D show a first embodiment of the present invention applied to formation of a contact plug on source/drain regions of a pair of MOSFETs which constitute a memory cell of a DRAM (dynamic RAM).

Figure 2A:
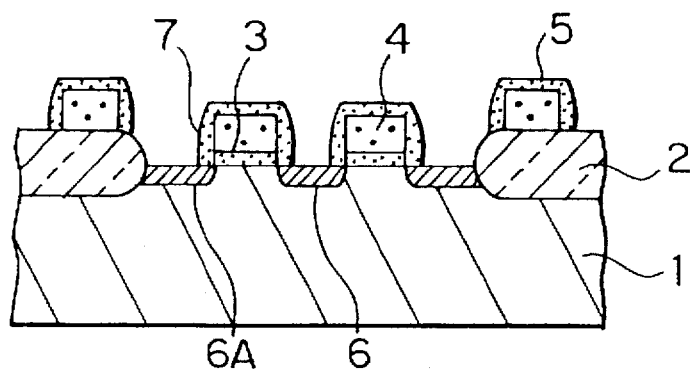
FIGS. 2A to 2D are cross-sectional views of a semiconductor device for illustrating a manufacturing method according to a first embodiment.

Initially, a gate oxide film 3 is formed in an element forming region of a silicon substrate 1 isolated by a field oxide film 2 formed thereon, as shown in FIG. 2A. A polycrystalline silicon 4 is then grown on top of the gate oxide film 3 and the field oxide film 2. Then, a silicon oxide film 5 is either deposited or grown on top of the polycrystalline silicon layer 4 so as to form a laminate including the gate oxide film 3, gate electrode 4 and silicon oxide film 5. Subsequently, the laminate is selectively etched so as to thereby define a laminate gate structure. Impurity ions are then introduced into the silicon substrate 1 by an ion implantation technique using self-alignment with the gate structure, thereby forming diffused regions 6 which function as source/drains of the resultant MOSFET.

Figure 2B:
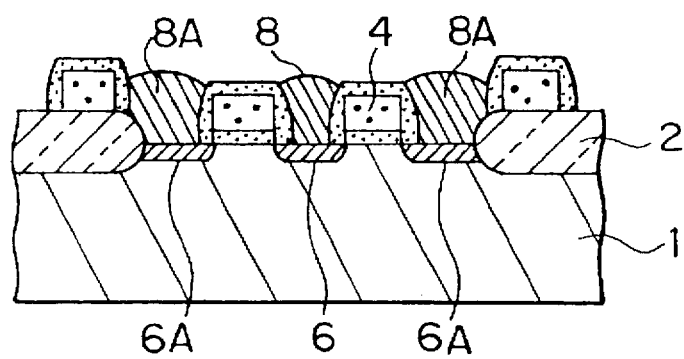

Subsequently, a silicon oxide film 7 is deposited over the entire surface by a CVD process, then subjected to an anisotropic etching technique to produce a covered gate structure in which the lateral side surfaces and the top surface of the gate electrode 4 are covered by the silicon oxide film 7, while the surface of the silicon substrate 1 is exposed at the diffused regions 6 adjacent to the opposite sides of the gate electrode 4. Then, a selective epitaxial growth of silicon is conducted at a temperature ranging between 500° and 800° C. by using a silicon hydride, such as $SiH_4$ gas or $Si_2H_6$ gas, as a source material to form low resistance epitaxial silicon layers 8 and 8A on the exposed diffused regions 6 and 6A, as shown in FIG. 2B. Impurity atoms of phosphorous are introduced for reduction of resistance in the epitaxial layer by adding $PH_3$ gas to the $Si_2H_6$ gas to obtain a high dosage of $7 \times 10^{19}$ atoms/cm$^3$ in the epitaxial layer.

If the growth temperature is lower than 500° C., the growth rate will be so low as to result low throughput, while if the growth temperature is above 800° C., the impurity atoms will not be well introduced in the resultant epitaxial layer. The internal pressure of the growth chamber for the process is maintained between $10^{-4}$ and $10^{-5}$ Torr so as to achieve a satisfactory anisotropy in the mutually orthogonal directions, namely, between the vertical direction and the horizontal direction during the epitaxial growth.

An excellent anisotropy between these directions can be obtained under conditions that $Si_2H_6$ gas is used as a source material, internal pressure of the growth chamber is maintained at about $3 \times 10^{-4}$ Torr, substrate temperature is maintained at about 700° C., which conditions collectively achieve a high anisotropic ratio of 10:1 between the growth rate in the vertical direction and that in the horizontal direction.

Figure 3:
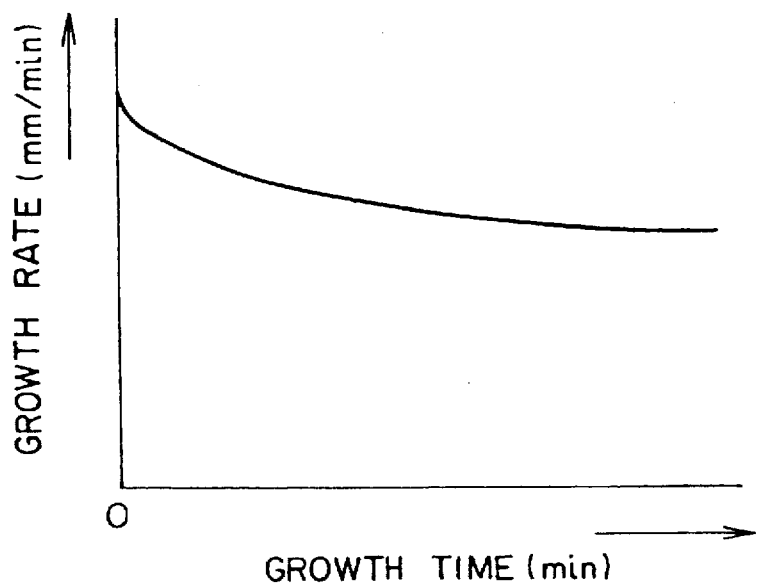
FIG. 3 is a graph showing growth time dependency of growth rate for the silicon layer in the first embodiment.
Figure 4:
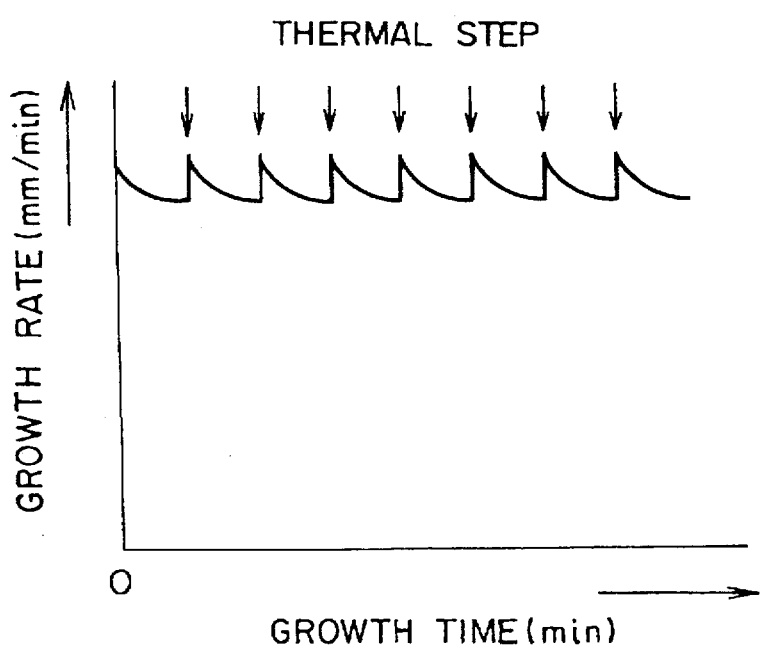
FIG. 4 is a graph showing improved growth time dependency of growth rate for the silicon layer in a modification of the first embodiment.

The high dosage of impurity atoms such as phosphorous atoms may reduce the growth rate of the epitaxial layer during the epitaxial process, as shown by FIG. 3, because of the segregation of the impurity atoms from the surface of the epitaxial layer. To avoid this problem, the epitaxial process should be periodically interrupted at a certain interval by a thermal process which raises the substrate temperature from the growth temperature, as shown by FIG. 4. Specifically, the thermal process preferably raises the substrate temperature by about 5° to 50° C. from the growth temperature so as to eliminate segregated impurity atoms located on the surface of the grown silicon, thereby raising the productivity of the epitaxial process. In this manner, a high anisotropy of the growth rate between the aforesaid directions can be obtained and silicon contact plugs 8 and 8A can be provided in such a way as to not cause short-circuit failure.

Figure 2C:
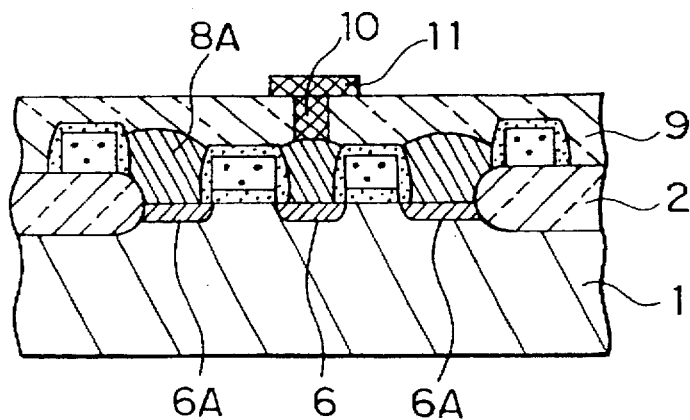
Figure 2D:
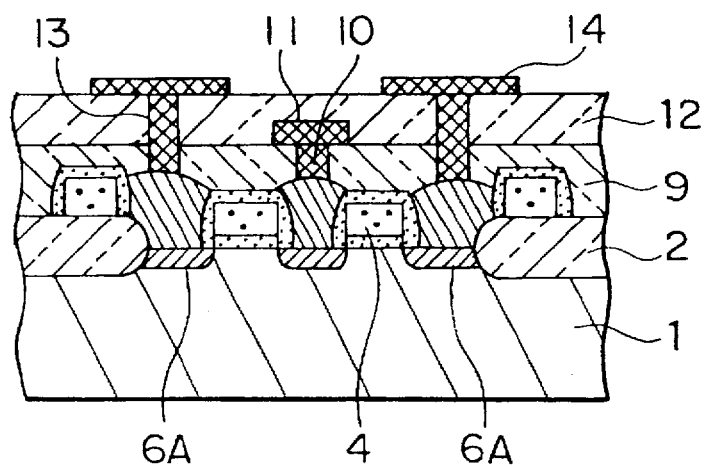

Subsequently, a first interlayer insulating film 9 of silicon oxide is deposited by a CVD process, as shown in FIG. 2C. A bit contact 10 is then formed so as to penetrate through the silicon oxide film 9 and so as to be in alignment with the epitaxial silicon plug 8. Subsequently, a bit line 11 is formed as an upper interconnect layer by deposition and patterning techniques. Thereafter, a second interlayer insulating film 12 is formed, and the first and second interlayer insulating films 9 and 12 are then selectively etched so as to receive capacitor contacts 13, which are formed on the epitaxial contacts 8A grown on the diffused regions 6A, as shown in FIG. 1D. While the description of the subsequent steps which are similar to conventional steps is omitted herein, a DRAM having a sub-quarter-micron memory cells, for example, can be formed in this manner.

Figure 5A:
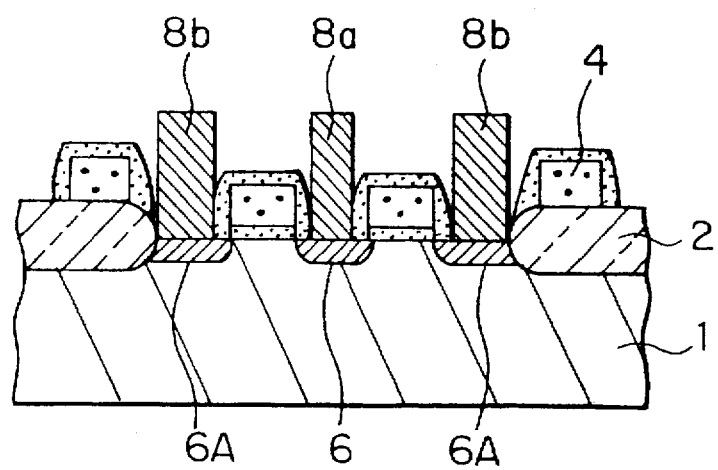
FIGS. 5A and 5B are cross-sectional views of a semiconductor device for illustrating modified, consecutive steps of the first embodiment.
Figure 5B:
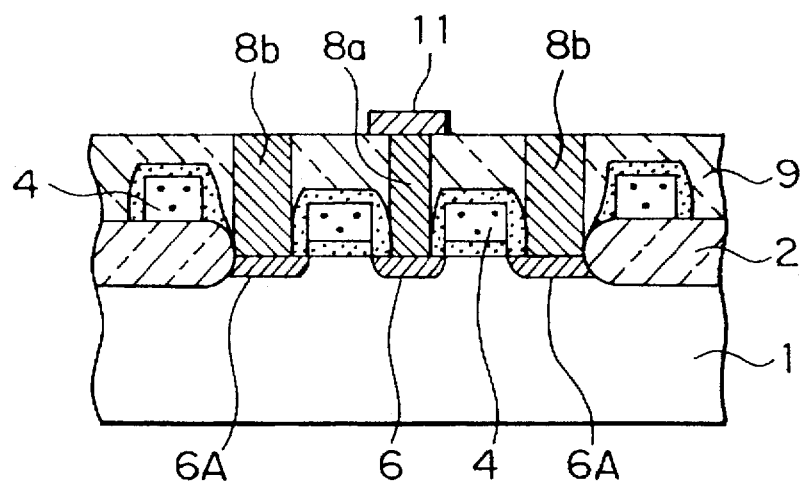

In a modification of the first embodiment, the epitaxial silicon layers 8a and 8b are grown up to an elevation higher than the gate electrode 4 on the field oxide film 2, as shown in FIG. 5A. The epitaxial silicon layers 8a and 8b thus formed are then subjected to a chemical-mechanical polishing (CMP) process after the silicon oxide film serving as the interlayer insulating film has been formed, so that the top surfaces of the epitaxial silicon layers 8a and 8b are exposed through the surface of the interlayer insulating film 9, as shown in FIG. 5B. In this manner, it will be seen that there is no need to form the bit contact 10 as formed in the first embodiment, thereby simplifying the structure of the semiconductor device and reducing the number of steps required.

Figure 6A:
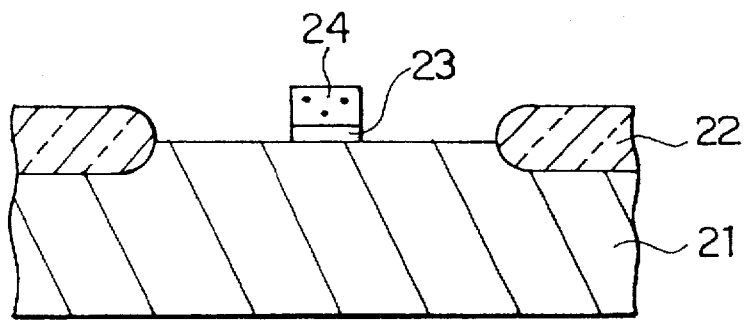
FIGS. 6A to 6D are cross-sectional views of a semiconductor device for illustrating a manufacturing method according to a second embodiment.
Figure 6B:
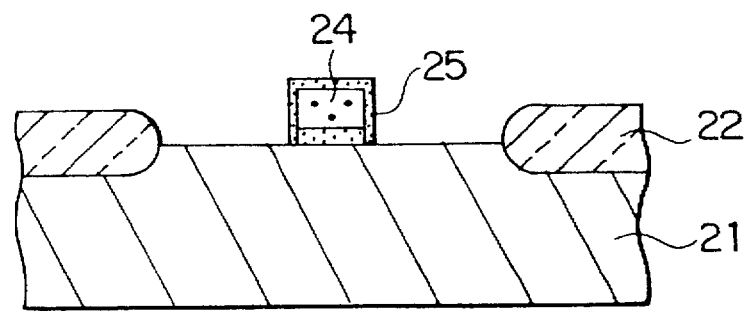
Figure 6C:
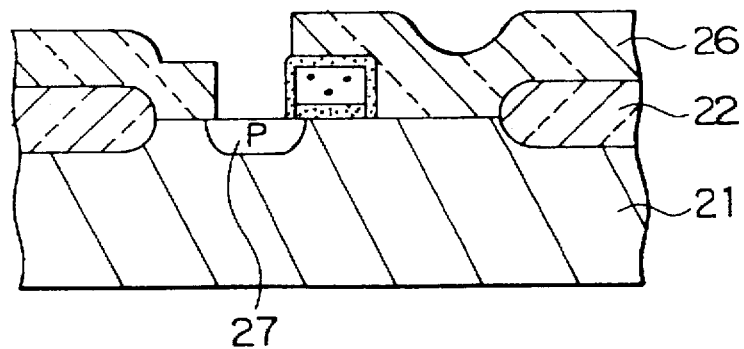

FIGS. 6A to 6D show a second embodiment of the invention. In the second embodiment, the method of manufacturing a semiconductor device according to the invention is applied to a vertical MOSFET. Initially, a field oxide film 22 is formed on a silicon substrate 21 for separation of element regions, followed by deposition of a silicon oxide film 23 and polycrystalline silicon film 24, which are then patterned into a desired configuration so as to define a gate electrode 24, as shown in FIG. 6A. Subsequently, a thin oxide film 25 is grown on the exposed surface of a the gate electrode 24 by a thermal oxidation process, as shown in FIG. 6B. In particular, a portion of the oxide film 25 formed on one of the lateral sides of the gate electrode 24 will be used as a gate oxide film. An interlayer insulating film 26 made of silicon oxide is then grown over the entire surface, and a portion of the insulating film 26 which extends along one of the lateral sides of the gate electrode 24 is removed by etching, thereby exposing the surface of the silicon substrate 21 in the region adjacent to the one of the lateral sides of the gate electrode 24, as shown in FIG. 6C. Impurity ions are then introduced into the exposed region of the silicon substrate 21 so as to form a P-type diffused region 27, for example.

Figure 6D:
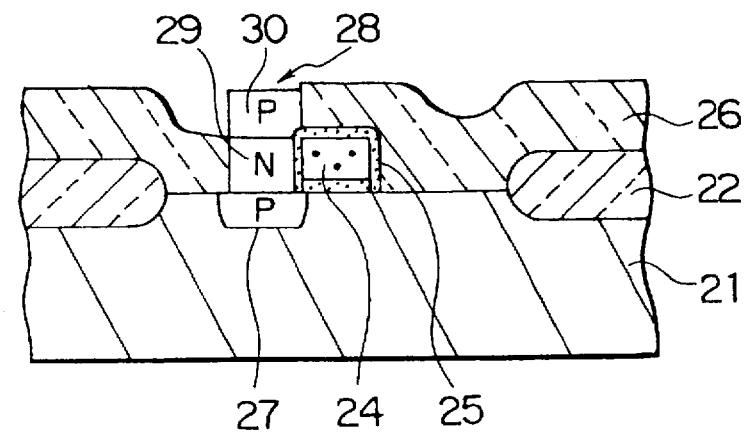

Subsequently, a selective epitaxial growth process is conducted by using a silicon hydride, such as $SiH_4$ or $Si_2H_6$ gas, as a source material and an impurity source gas at a substrate temperature between 500° and 800° C. and under an internal pressure in the chamber between $10^{-4}$ and $10^{-5}$ Torr. As a result, an epitaxial silicon layer 28 is grown on the exposed surface of the silicon substrate 21 or the surface of the P-type diffused region 27, as shown in FIG. 6D. When $Si_2H_6$ gas is was selected as a source material, under conditions of internal pressure of $3\times10^{-4}$ Torr and substrate temperature of 700° C., then an excellent anisotropy of the growth rate as high as 10:1 is obtained between the vertical direction and the growth rate in the horizontal direction. By consecutively introducing N-type impurity source gas and P-type impurity source gas into the epitaxial silicon layer as the epitaxial growth proceeds, N- and P-type epitaxial layers 29 and 30 can be obtained as the epitaxial silicon layer 28, the N-type impurity layers 29 being formed over a vertical range which is substantially equal to the height of the gate electrode 24 and the P-type impurity layer 30 being formed thereon to thereby form a laminated source/drain configuration of a MOSFET.

Subsequently, a second interlayer insulating film is formed over the entire surface (not shown) and a contact which is electrically connected to the upper P-type layer 30 is formed by using a conventional method while the N-type layer 29 is electrically connected to another interconnect layer at a location, not shown, which is spaced in a direction perpendicular to the plane of the drawing. In this manner, a vertical MOSFET can be formed which comprises the gate electrode 24, gate oxide film 25, the P-type diffused region 27 in the silicon substrate 21, N-type epitaxial layer 29 and P-type epitaxial layer 30, the P-type diffused region 27 and P-type epitaxial layer 30 serving as source/drain of the MOSFET. The new structure of the vertical MOSFET enables a high level of integration.

Figure 7:
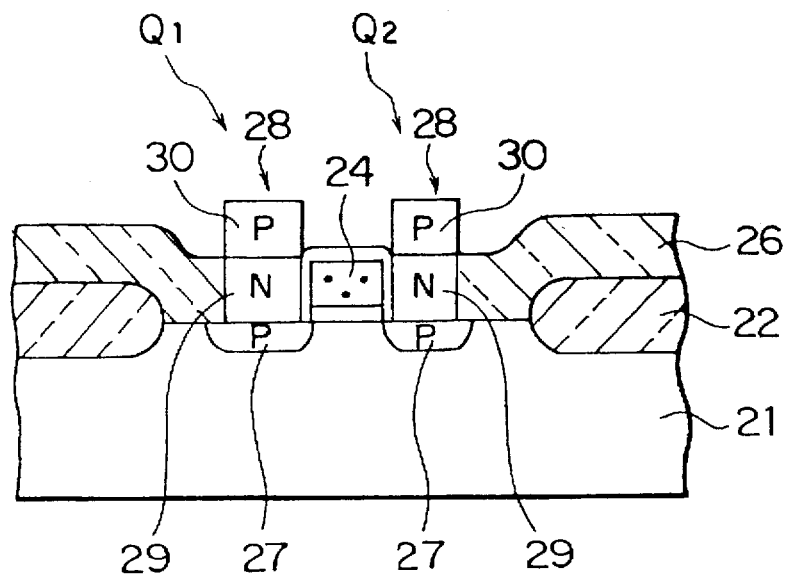
FIG. 7 is a cross-sectional view of a semiconductor device fabricated by modified steps of the second embodiment.
Figure 8:
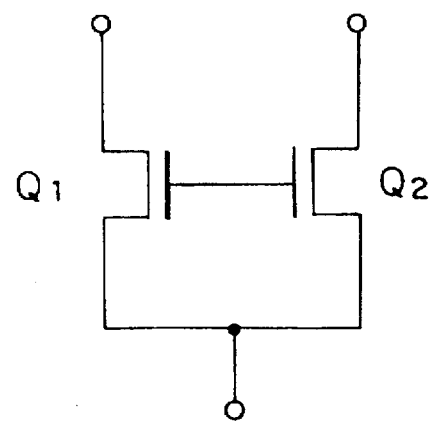
FIG. 8 is an equivalent circuit diagram of the semiconductor device of FIG. 7.

FIGS. 7 and 8 show a cross-sectional view and circuit diagram of a semiconductor device obtained by a modification of the second embodiment. As illustrated in FIG. 7, the silicon substrate 21 in this modification is exposed at the regions adjacent to the opposite sides of the gate electrode 24, and an ion implantation and subsequent epitaxial growth are conducted on the respective exposed surfaces of the silicon substrate 21 so as to form a pair of vertical MOSFETs Q1 and Q2 which are connected in parallel in a memory cell, as shown in FIG. 8. Although the invention is described with reference to preferred embodiments thereof, the invention is not limited to those embodiments, and it is apparent that various modifications or alterations will be easily made from these embodiments without departing from the scope of the invention.

What is claimed is:

1. A method for forming a semiconductor device comprising the steps of forming a diffused region in a portion of a surface region of a semiconductor substrate made of a first material, and selectively growing a semiconductor layer made of the first material and formed on the diffused layer under a condition that a ratio of a growth rate in a first direction perpendicular to the surface of the semiconductor substrate to a growth rate in a second direction parallel to the surface of the semiconductor substrate is not lower than about 3:1.

2. A method for forming a semiconductor device as defined in claim 1 wherein said first material is monocrystalline silicon and said selectively growing is conducted at a temperature between 500° and 800° C.

3. A method for forming a semiconductor device as defined in claim 2 wherein said selectively growing is conducted using silicon hydride as a source material.

4. A method for forming a semiconductor device as defined in claim 3 wherein said selectively growing is conducted under a chamber pressure between $10^{-4}$ and $10^{-5}$ Torr.

5. A method for forming a semiconductor device as defined in claim 4 wherein said selectively growing includes two steps for accomplishing said selectively growing and said method further includes a step of eliminating impurities segregated on the surface of the substrate between two steps for accomplishing said selectively growing.

6. A method for forming a semiconductor device as defined in claim 5 wherein said eliminating includes heating the substrate to a temperature higher than a temperature of the substrate during said selectively growing by 5° to 50° C.

7. A method for forming a semiconductor device as defined in claim 3 wherein said silicon hydride is selected from $SiH_4$ or $Si_2H_6$.

8. A method for forming a semiconductor device comprising the steps of forming consecutively a gate oxide film and a gate electrode on a semiconductor substrate made of a first material, introducing impurity ions into a portion of a surface region of the semiconductor substrate by a self alignment with the gate electrode to form a diffused region, forming an insulating layer covering an entire surface other than at least a portion of the diffused region, anisotropically growing the first material on at least the portion of the diffused region to form a semiconductor layer under a condition that a growth rate in a first direction perpendicular to the surface of the semiconductor substrate is larger than a growth rate in a second direction parallel to the surface of the semiconductor substrate, forming an insulating layer at least on the semiconductor layer, and forming a conductive layer on the insulating layer.

9. A method for forming a semiconductor device as defined in claim 8 wherein ratio of the growth rate in the first direction to the growth rate in the second direction is not lower than about 3:1.

10. A method for forming a semiconductor device including the steps of forming consecutively a first insulating film and a gate electrode on a semiconductor substrate, forming a second insulating film having a first surface in contact with at least on side of the gate electrode, introducing impurity ions in a region of the semiconductor substrate adjacent to a second surface of the second insulating film opposing said first surface in contact with said at least one side of the gate electrode to form a diffused region of a first conductivity type, forming a first selective epitaxial layer on the second surface of the second insulating film and on the diffused region, and forming a second selective epitaxial layer on the first selective epitaxial layer, wherein ratio of a growth rate of at least said first selective epitaxial layer in a first direction perpendicular to a surface of the semiconductor substrate to a growth rate in a second direction parallel to the surface of the semiconductor substrate is greater than 1.

11. A method for forming a semiconductor device as defined in claim 10 wherein the ratio of the growth rate in the first direction to the growth rate in the second direction is not lower than about 3:1.

12. A method for forming a semiconductor device as defined in claim 10 wherein said at least one side of the gate electrode includes both sides of the gate electrode.

13. A method for forming a semiconductor device including the steps of forming a diffused region in a portion of a surface region of a semiconductor substrate made of a first material, and selectively growing a semiconductor layer made of the first material and formed on the diffused layer under a condition that a growth rate in a first direction perpendicular to the surface of the semiconductor substrate is larger than a growth rate in a second direction parallel to the surface of the semiconductor substrate.

14. A method for forming a semiconductor device as defined in claim 13 wherein said first material is monocrystalline silicon and said selectively growing is conducted at a temperature between 500° and 800° C.

15. A method for forming a semiconductor device as defined in claim 14 wherein said selectively growing is conducted using silicon hydride as a source material.

16. A method for forming a semiconductor device as defined in claim 15 wherein said selectively growing is conducted under a chamber pressure between $10^{-4}$ and $10^{-5}$ Torr.

17. A method for forming a semiconductor device as defined in claim 16 wherein said selectively growing includes two steps for accomplishing said selectively growing and said method further includes a step of eliminating impurities segregated on the surface of the substrate between the two steps for accomplishing said selectively growing.

18. A method for forming a semiconductor device as defined in claim 17 wherein said eliminating includes heating the substrate to a temperature higher than a temperature of the substrate during said selectively growing by 5° to 50° C.

19. A method for forming a semiconductor device as defined in claim 15 wherein said silicon hydride is selected from $SiH_4$ or $Si_2H_6$.

20. A method for forming a semiconductor device as defined in claim 13 wherein ratio of the growth rate in the first direction to the growth rate in the second direction is about 10:1.

21. A method for forming a semiconductor device as defined in claim 9 wherein ratio of the growth rate in the first direction to the growth rate in the second direction is about 10:1.

22. A method for forming a semiconductor device as defined in claim 11, wherein the ratio is about 10:1.

* * * * *

UNITED STATES PATENT AND TRADEMARK OFFICE
CERTIFICATE OF CORRECTION

PATENT NO.   : 5,753,555
DATED        : May 19, 1998
INVENTOR(S)  : Hiromitsu Hada It is certified that error appears in the above-identified patent and that said Letters Patent is hereby corrected as shown below:

Claim 10, col. 7, line 5, "on" should be --one--.

Signed and Sealed this

Twenty-second Day of September, 1998

*Attest:*

BRUCE LEHMAN

*Attesting Officer*   *Commissioner of Patents and Trademarks*